(12) United States Patent
Tan (10) Patent No.: US 11,405,002 B2
(45) Date of Patent: Aug. 2, 2022

(54) HARMONIC REJECTION MIXING CIRCUIT DEVICE AND RECEIVER

(71) Applicant: Hangzhou Geo-chip Technology Co., Ltd., Hangzhou (CN)

(72) Inventor: Chun Geik Tan, San Diego, CA (US)

(73) Assignee: Hangzhou Geo-Chip Technology Co., Ltd., Hangzhou (CN)

( * ) Notice: Subject to any disclaimer, the term of this patent is extended or adjusted under 35 U.S.C. 154(b) by 0 days.

(21) Appl. No.: 17/126,821

(22) Filed: Dec. 18, 2020

(65) Prior Publication Data

US 2022/0200531 A1 Jun. 23, 2022

(51) Int. Cl.
  *H03D 7/14* (2006.01)
  *H03F 3/45* (2006.01)
  *H04B 1/16* (2006.01)

(52) U.S. Cl.
  CPC ......... *H03D 7/1458* (2013.01); *H03D 7/1441* (2013.01); *H03F 3/45475* (2013.01); *H04B 1/16* (2013.01)

(58) Field of Classification Search
  CPC .................................................. H03D 7/1458
  USPC ........................................................ 375/316
  See application file for complete search history.

(56) References Cited

U.S. PATENT DOCUMENTS

2013/0035053 A1* 2/2013 Liao ....................... H04B 1/109
                                                                455/335
2018/0139078 A1* 5/2018 Mittal .................. H03D 7/1458

\* cited by examiner

*Primary Examiner* — Lihong Yu
(74) *Attorney, Agent, or Firm* — McDonnell Boehnen Hulbert & Berghoff LLP (57) ABSTRACT

The present disclosure discloses a harmonic rejection mixing circuit device and a receiver. In the harmonic rejection mixing circuit device, outputs of first and fourth mixers are combined with the input terminal of the fourth mixer being connected to a capacitor, the first mixer samples a first group of local oscillator (LO) signals, and the fourth mixer phase-invertedly samples the first group of LO signals, thus the noise introduced by a fundamental LO signal input to the first mixer may be eliminated using the double balance feature of the fourth mixer core, thereby ensuring a high signal-to-noise ratio of the receiver. Similarly, the noises introduced by fundamental LO signals input to second and third mixers may be eliminated respectively using the double balance features of the fifth and sixth mixer cores, thereby lowering the noise figure to ensure a high signal-to-noise ratio of the receiver.

17 Claims, 7 Drawing Sheets

HARMONIC REJECTION MIXING CIRCUIT DEVICE AND RECEIVER

TECHNICAL FIELD

The present disclosure relates to the field of communication technologies, and in particular, to a harmonic rejection mixing circuit device and a receiver.

BACKGROUND

In a traditional receiver, a Radio Frequency (RF) signal is received via its antenna, and then may be sequentially passed through a band-pass or low-pass filter, a Matching Network (MN), a Low-Noise Amplifier (LNA), a mixer, an analog baseband filter, an Analog-to-Digital Converter (ADC) and a digital demodulator on a Printed Circuit Board (PCB), thereby obtaining a required signal, where the mixer is a common microwave device that has evolved into various types, as one of which, a Harmonic Rejection Mixer (HRM) has a basic structure formed by three sub-mixing links, with each link consisting of an amplifier and a mixer. During down conversion, the RF signal may be subject to noise interference, and currently the interference of noise introduced by the third and fifth harmonics of a local oscillator (LO) signal can be rejected via the HRM generally, but the interference of noise introduced by the fundamental LO signal cannot be rejected.

SUMMARY

The present disclosure provides a harmonic rejection mixing circuit device and a receiver, in order to overcome or alleviate one or more problems of the prior art and at least provide a beneficial alternative.

In a first aspect, an embodiment provides a harmonic rejection mixing circuit device, including a signal amplifying circuit, a first mixer, a second mixer, a third mixer, a fourth mixer, a fifth mixer and a sixth mixer, where the circuit device is configured such that:

the first mixer, the second mixer and the third mixer are connected in parallel, input terminals of the first mixer, the second mixer and the third mixer all receiving an RF signal, input terminals of the fourth mixer, the fifth mixer and the sixth mixer being respectively connected to capacitors, and outputs of the first mixer, the second mixer, the third mixer, the fourth mixer, the fifth mixer and the sixth mixer being combined to be input to the signal amplifying circuit; and the first mixer samples a first group of local oscillator (LO) signals, and the fourth mixer phase-invertedly samples the first group of LO signals; the second mixer samples a second group of LO signals, and the fifth mixer phase-invertedly samples the second group of LO signals; the third mixer samples a third group of LO signals, and the sixth mixer phase-invertedly samples the third group of LO signals.

In some embodiments, each of the first mixer, the second mixer, the third mixer, the fifth mixer and the sixth mixer comprises a first mixed-signal output terminal and a second mixed-signal output terminal, with all first mixed-signal output terminals connected to each other at a first joint and all second mixed-signal output terminals connected to each other at a second joint, both the first joint and the second joint being connected to the signal amplifying circuit.

In some embodiments, each of the first mixer and the fourth mixer further comprises a first LO signal input terminal and a second LO signal input terminal, with the first LO signal input terminal of the first mixer and the second LO signal input terminal of the fourth mixer both configured to receive a first LO signal, and the second LO signal input terminal of the first mixer and the first LO signal input terminal of the fourth mixer both configured to receive a second LO signal.

In some embodiments, the first LO signal and the second LO signal have phases of 45° and 135° respectively; or the first LO signal and the second LO signal have phases of 45° and −135° respectively.

In some embodiments, each of the second mixer and the fifth mixer comprises a first LO signal input terminal and a second LO signal input terminal, with the first LO signal input terminal of the second mixer and the second LO signal input terminal of the fifth mixer both configured to receive a third LO signal, and the second LO signal input terminal of the second mixer and the first LO signal input terminal of the fifth mixer both configured to receive a fourth LO signal.

the third LO signal and the fourth LO signal have phases of 0° and 180° respectively, or the third LO signal and the fourth LO signal have phases of 90° and −90° respectively.

In some embodiments, each of the third mixer and the sixth mixer comprises a first LO signal input terminal and a second LO signal input terminal, with the first LO signal input terminal of the third mixer and the second LO signal input terminal of the sixth mixer both configured to receive a fifth LO signal, and the second LO signal input terminal of the third mixer and the first LO signal input terminal of the sixth mixer both configured to receive a sixth LO signal.

the fifth LO signal and the sixth LO signal have phases of 45° and −135° respectively; or the fifth LO signal and the sixth LO signal have phases of −45° and 135° respectively.

In some embodiments, the signal amplifying circuit comprises a first stage of amplifier and first resistors, the first stage of amplifier comprising a first input terminal, a second input terminal, a first output terminal and a second output terminal, with the first resistors respectively connected in parallel between the first input terminal and the first output terminal as well as between the second input terminal and the second output terminal, where the first input terminal is connected to the first joint and the second input terminal is connected to the second joint.

In some embodiments, the signal amplifying circuit includes: a first stage of amplifier, first resistors, a second stage of amplifier and second resistors, where:

each of the first stage of amplifier and the second stage of amplifier comprises a first input terminal, a second input terminal, a first output terminal and a second output terminal, with the first output terminal of the first stage of amplifier connected to the first input terminal of the second stage of amplifier, and the second output terminal of the first stage of amplifier connected to the second input terminal of the second stage of amplifier;

the first resistors are respectively connected in parallel between the first input terminal of the first stage of amplifier and the first output terminal of the second stage of amplifier as well as between the second input terminal of the first stage of amplifier and the second output terminal of the second stage of amplifier, and the second resistors are respectively connected in parallel between the first input terminal of the second stage of amplifier and the first output terminal of the second stage of amplifier as well as between the second input terminal of the second stage of amplifier and the second output terminal of the second stage of amplifier.

In some embodiments, the first stage of amplifier and/or the second stage of amplifier includes a single-stage complementary metal oxide semiconductor circuit unit.

In some embodiments, the first stage of amplifier and/or the second stage of amplifier includes a multi-stage complementary metal oxide semiconductor circuit unit.

In some embodiments, the first mixer includes a first transistor switch and a second transistor switch, each of which comprises a gate, a drain and a source, where:

the gate of the first transistor switch is configured to receive the first LO signal, and the gate of the second transistor switch is configured to receive the second LO signal;

the source of the first transistor switch and the source of the second transistor switch are connected to each other and configured to receive the RF signal;

the drain of the first transistor switch functions as the first mixed-signal output terminal of the first mixer, and the drain of the second transistor switch functions as the second mixed-signal output terminal of the first mixer.

In some embodiments, the fourth mixer includes a first transistor switch and a second transistor switch, each of which comprises a gate, a source and a drain, where:

the gate of the first transistor switch is configured to receive the second LO signal, and the gate of the second transistor switch is configured to receive the first LO signal;

the source of the first transistor switch functions as the first mixed-signal output terminal of the fourth mixer, and the source of the second transistor switch functions as the second mixed-signal output terminal of the fourth mixer;

the drain of the first transistor switch and the drain of the second transistor switch are both connected to one of the capacitors.

In a second aspect, an embodiment provides a receiver including at least one harmonic rejection mixing circuit device described above.

By employing the above technical solutions, the present disclosure has the advantages below: outputs of first and fourth mixers are combined, with the input terminal of the fourth mixer being connected to a capacitor, the first mixer samples a first group of LO signals, and the fourth mixer phase-invertedly samples the first group of LO signals, thus the noise introduced by a fundamental LO signal that is input to the first mixer may be eliminated using the double balance feature of the fourth mixer core, thereby ensuring a high signal-to-noise ratio of the receiver. Similarly, the noises introduced by fundamental LO signals that are respectively input to second and third mixers may be respectively eliminated using the double balance features of fifth and sixth mixer cores, thereby lowering the noise figure to ensure a high signal-to-noise ratio of the receiver.

The above description is provided for the purpose of better understanding of the present disclosure, but is not intended to limit the present disclosure in any way. In addition to the illustrative aspects, embodiments and features as described herein with reference to the drawings, additional aspects, embodiments and features would become apparent to those skilled in the art.

BRIEF DESCRIPTION OF THE DRAWINGS

Unless otherwise specified, the similar reference numerals represent the same or similar components or elements throughout the drawings. These drawings are not necessarily drawn to scale. It should be appreciated that these drawings merely illustrate some embodiments of the present disclosure and are not intended to limit the scope of the present disclosure. The drawings are for the purpose of a better understanding of the present disclosure and do not constitute a limitation to the present disclosure.

| List of reference numerals | | |
|---|---|---|
| 10 First Mixer | | |
| 110 Input Terminal | | 121 First LO Signal Input Terminal |
| 122 Second LO Signal Input Terminal | | 130 First Mixed-signal Output Terminal |
| 140 Second Mixed-signal Output Terminal | | |
| 20 Second Mixer | | |
| 210 Input Terminal | | 221 First LO Signal Input Terminal |
| 222 Second LO Signal Input Terminal | | 230 First Mixed-signal Output Terminal |
| 240 Second Mixed-signal Output Terminal | | |
| 30 Third Mixer | | |
| 310 Input Terminal | | 321 First LO Signal Input Terminal |
| 322 Second LO Signal Input Terminal | | 330 First Mixed-signal Output Terminal |
| 340 Second Mixed-signal Output Terminal | | |
| 40 Fourth Mixer | | |
| 440 Input Terminal | | 431 First LO Signal Input Terminal |
| 432 Second LO Signal Input Terminal | | 410 First Mixed-signal Output Terminal |
| 420 Second Mixed-signal Output Terminal | | 31 First Capacitor |
| 50 Fifth Mixer | | |
| 540 Input Terminal | | 531 First LO Signal Input Terminal |
| 532 Second LO Signal Input Terminal | | 510 First Mixed-signal Output Terminal |
| 520 Second Mixed-signal Output Terminal | | 32 Second Capacitor |

| List of reference numerals | |
|---|---|
| 60 Sixth Mixer | |
| 640 Input Terminal | 631 First LO Signal Input Terminal |
| 632 Second LO Signal Input Terminal | 610 First Mixed-signal Output Terminal |
| 620 Second Mixed-signal Output Terminal | 33 Third Capacitor |
| A First Joint | B Second Joint |
| 70 Signal Amplifying circuit | |
| 710 First Stage of Amplifier | 711 First Input Terminal |
| 712 Second Input Terminal | 713 First Output Terminal |
| 714 Second Output Terminal | |
| 720 Second Stage of Amplifier | 721 Third Input Terminal, |
| 722 Fourth Input Terminal | 723 Third Output Terminal |
| 724 Fourth Output Terminal | |
| 111 First Transistor Switch of First Mixer | |
| 112 Second Transistor Switch of First Mixer | |
| 113 First Transistor Switch of Fourth Mixer | |
| 114 Second Transistor Switch of Fourth Mixer | |
| 1 First Harmonic Rejection Circuit Device | |
| 2 Second Harmonic Rejection Circuit Device | |
| 3 Third Harmonic Rejection Circuit Device | |
| 4 Fourth Hai ionic Rejection Circuit Device. | |

DETAILED DESCRIPTION

In the following description, only some exemplary embodiments are described. As will be appreciated by those skilled in the art, the described embodiments may be modified in various ways without departing from the spirit or scope of the present disclosure. Therefore, the drawings and descriptions are to be regarded as illustrative in nature rather than restrictive.

In the description of the present disclosure, it should be understood that terms such as center, longitudinal, transverse, length, width, thickness, upper, lower, front, rear, left, right, vertical, horizontal, top, bottom, inner, outer, clockwise, counterclockwise, axial, radial, and circumferential indicate an orientation or positional relationship that is based on the orientation or positional relationship shown in the drawings for the sake of the convenient and simplified description of the present disclosure, but do not indicate or imply that the involved device or element necessarily has or operates in the specified orientation, and thus should not be understood as a limitation of the present disclosure.

In addition, the terms "first" and "second" are used for differentiating technical features, but are not intended to indicate or imply the importance of these technical features or implicitly show the number of these technical features. Thus, technical features defined with the terms "first" and "second" may explicitly or implicitly include one or more of the technical features. In the description of the present disclosure, the expression of "a plurality of" means two or more, unless otherwise specifically defined.

In the present disclosure, unless otherwise specified and defined explicitly, the terms "arranged", "coupled", "connected", "fixed" and the like should be understood in a broad sense, and may refer to, for example, a fixed or detachable connection or being integrated; a mechanical, electrical or communication connection; a direct connection or an indirect connection through an intermediate medium; or a communication between interiors of two elements or the interaction between two elements. The specific meanings of the above terms in the present disclosure may be understood by those skilled in the art depending on the specific context.

In the present disclosure, unless otherwise specified and defined explicitly, a first feature being "above" or "below" a second feature includes that the first feature and the second feature are in direct contact with each other, or that the first and second features are not in direct contact with each other with an additional feature placed therebetween. Moreover, the first feature being "above", "over" or "on" the second feature may include that the first feature is right above or obliquely above the second feature, or simply that the first feature is higher in level than the second feature. Likewise, the first feature being "below", "beneath" or "under" the second feature may include that the first feature is right below or obliquely below the second feature, or simply that the first feature is lower in level than the second feature.

The following disclosure provides various embodiments or examples for illustrating the implementation of various structures of the present disclosure. In order to simplify the disclosure of the present disclosure, components and arrangements of specific examples are described below. Of course, these examples are merely illustrative, but not intended to limit the present disclosure. In addition, the same reference numerals and/or characters may be used throughout different examples for the sake of simplification and clarity, but do not necessarily mean any relationship between the various embodiments or examples. Additionally, examples of various specific processes and materials are provided in the present disclosure, but the disclosure of other processes and/or other materials may readily occur to one of ordinary skills in the art.

Figure 1:
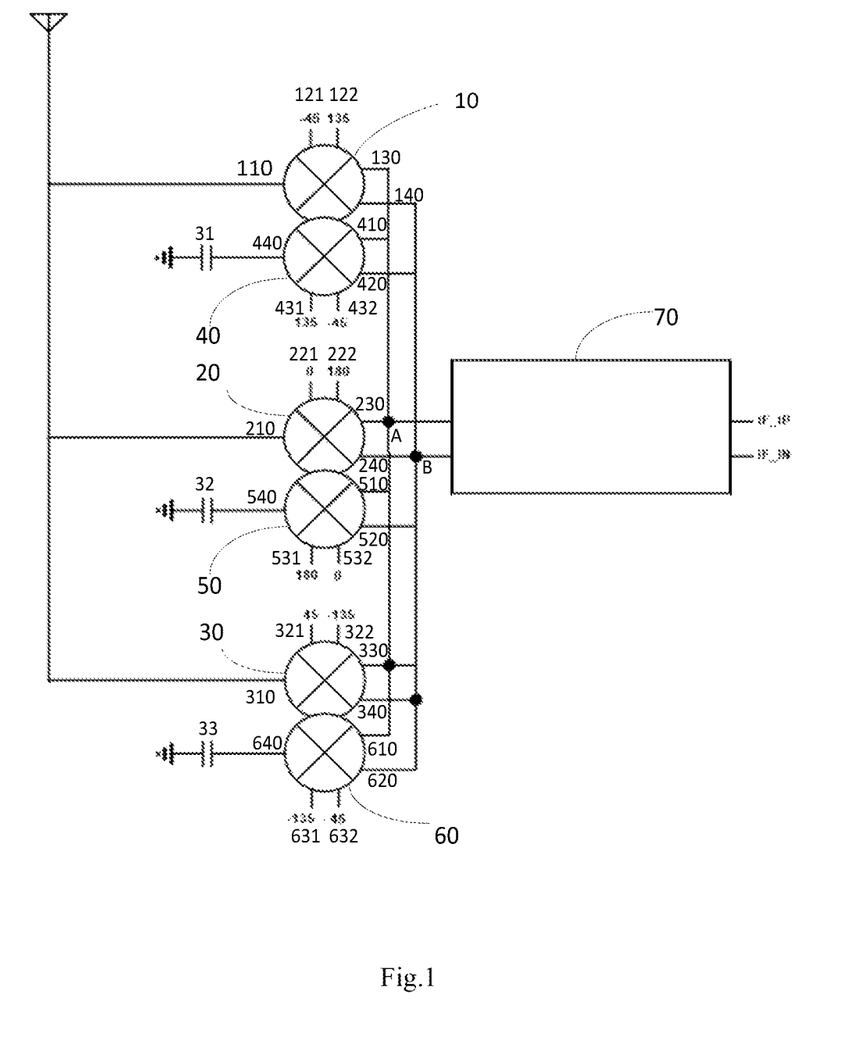
FIG. 1 is a schematic structural diagram of a harmonic rejection mixing circuit device according to an embodiment of the disclosure.

As shown in FIG. 1, in one specific embodiment, there provides a harmonic rejection mixing circuit device including a signal amplifying circuit 70, a first mixer 10, a second mixer 20, a third mixer 30, a fourth mixer 40, a fifth mixer 50 and a sixth mixer 60.

The input terminals 110, 210, 310 of the first mixer 10, the second mixer 20 and the third mixer 30 are all configured to receive an RF signal; the output terminals of the first mixer 10, the second mixer 20 and the third mixer 30 are connected to each other.

The output terminals of the fourth mixer 40 is connected to the output terminals of the first mixer 10, the first mixer 10 samples a first group of LO signals, and the fourth mixer 40 phase-invertedly samples the first group of LO signals; the output terminals of the fifth mixer 50 is connected to the output terminals of the second mixer 20, the second mixer 20 samples a second group of LO signals, and the fifth mixer 50 phase-invertedly samples the second group of LO signals; the output terminals of the sixth mixer 60 is connected to the output of the third mixer 30; the third mixer 30 samples a third group of LO signals, and the sixth mixer 60 phase-invertedly samples the third group of LO signals; the input terminals 440, 540, 640 of the fourth mixer, the fifth mixer and the sixth mixer are respectively connected to capacitors.

The output terminals of the first mixer 10, the second mixer 20, the third mixer 30, the fourth mixer 40, the fifth mixer 50 and the sixth mixer 60 are all connected to the signal amplifying circuit 70.

In one example, the antenna for receiving the RF signal is connected to the input terminals of the first mixer 10, the second mixer 20 and the third mixer 30. The first mixer 10 further includes two LO signal input terminals for sampling a first group of LO signals, the second mixer 20 further includes two LO signal input terminals for sampling a second group of LO signals, and the third mixer 30 further includes two LO signal input terminals for sampling a third group of LO signals, and the output terminals of the first mixer 10, the second mixer 20 and the third mixer 30 are connected to each other. Via the above connection manner, the interference of noise introduced by LO signals with third and fifth harmonics at the first mixer 10, the second mixer 20 and the third mixer 30 may be eliminated.

The fourth mixer 40 phase-invertedly samples the first group of LO signals. Herein, the phase-inverted sampling refers to that a local oscillator signal, which is input and sampled at a local oscillator signal input terminal of a mixer, has an inverted phase compared with the case where the local oscillator signal input and sampled at the corresponding local oscillator signal input terminal of another mixer. For example, if an LO signal with a phase of −45° is input to the first LO signal input terminal 121 of the first mixer 10 and an LO signal with a phase of 135° is input to the second LO signal input terminal 122 when the two LO signal input terminals of the first mixer 10 sample the first group of LO signals, then the phase-invertedly sampling of the first group of LO signals at the fourth mixer 40 refers to that the LO signal with a phase of 135° is input to the first LO signal input terminal 431 of the fourth mixer 40 and the LO signal with a phase of −45° is input to the second LO signal input terminal 432. Moreover, the fifth mixer 50 phase-invertedly samples the second group of LO signals, and the sixth mixer 60 phase-invertedly samples the third group of LO signals, in a similar way as that the fourth mixer 40 phase-invertedly samples the first group of LO signals.

The input terminal 440 of the fourth mixer 40 is connected to a first capacitor 31, the input terminal 540 of the fifth mixer 50 is connected to a second capacitor 32, and the input terminal 640 of the sixth mixer 60 is connected to a third capacitor 33. These capacitors may be configured to counterbalance the impedance of the antenna.

In this embodiment, there provides a harmonic rejection mixing circuit device, in which an output terminal of a fourth mixer is connected to an output terminal of a first mixer, with an input terminal of the fourth mixer connected to a capacitor, the first mixer samples a first group of LO signals, and the fourth mixer phase-invertedly samples the first group of LO signals, thus the noise introduced by a fundamental LO signal that is input to the first mixer 10 may be eliminated via the double balance feature of the fourth mixer 40 core, thereby ensuring a high signal-to-noise ratio of the receiver. Similarly, the noise introduced by a fundamental LO signal that is input by the second mixer 20 may be eliminated via the double balance feature of the fifth mixer 50 core, and the noise introduced by a fundamental LO signal that is input to the third mixer 30 may be eliminated via the double balance feature of the sixth mixer 60 core, thereby lowering the noise figure to ensure a high signal-to-noise ratio of the receiver.

In one embodiment, as shown in FIG. 1, the first mixed-signal output terminals 130, 230, 330, 410, 510, 610 of the first mixer 10, the second mixer 20, the third mixer 30, the fourth mixer 40, the fifth mixer 50 and the sixth mixer 60 are connected to each other at a first joint A.

The second mixed-signal output terminals 140, 240, 340, 420, 520, 620 of the first mixer 10, the second mixer 20, the third mixer 30, the fourth mixer 40, the fifth mixer 50 and the sixth mixer 60 are connected to each other at a second joint B.

The first joint A and the second joint B are connected to the signal amplifying circuit 70.

In one example, the output terminals of the first mixer 10 include a first mixed-signal output terminal 130 and a second mixed-signal output terminal 140; the output terminals of the second mixer 20 include a first mixed-signal output terminal 230 and a second mixed-signal output terminal 240; the output terminals of the third mixer 30 include a first mixed-signal output terminal 330 and a second mixed-signal output terminal 340; the output terminals of the fourth mixer 40 include a first mixed-signal output terminal 410 and a second mixed-signal output terminal 420; the output terminals of the fifth mixer 50 include a first mixing input terminal 510 and a second mixing input terminal 520; and the output terminals of the sixth mixer 60 include a first mixing input terminal 610 and a second mixing input terminal 620.

In one embodiment, as shown in FIG. 1, the first mixer 10 includes a first LO signal input terminal 121 and a second LO signal input terminal 122, and the fourth mixer 40 includes a first LO signal input terminal 431 and a second LO signal input terminal 432, where the first LO signal input terminal 121 of the first mixer 10 and the second LO signal input terminal 432 of the fourth mixer 40 are both configured to receive a first LO signal; the second LO signal input terminal 122 of the first mixer 10 and the first LO signal input terminal 431 of the fourth mixer 40 are both configured to receive a second LO signal.

In one embodiment, the first LO signal has a phase of −45°, and the second LO signal has a phase of 135°; or the first LO signal has a phase of 45°, and the second LO signal has a phase of −135°.

In one example, as shown in FIG. 1, in the first mixer 10, the first LO signal input terminal 121 receives a first LO signal with a phase of −45°, and the second LO signal input terminal 122 receives a second LO signal with a phase of 135°, and in the fourth mixer 40, the first LO signal input terminal 431 receives a second LO signal with a phase of 135°, and the second LO signal input terminal 432 receives a first LO signal with a phase of −45°. Of course, as an alternative, in the first mixer 10, the first LO signal input terminal 121 receives a first LO signal with a phase of 45°, and the second LO signal input terminal 122 receives a second LO signal with a phase of −135°, and in the fourth mixer 40, the first LO signal input terminal 431 receives a second LO signal with a phase of −135°, and the second LO signal input terminal 432 receives a first LO signal with a phase of 45°.

In this embodiment, there occurs cancellation of mixer noise between the first mixer 10 and the fourth mixer 40, thus port noise introduced by a fundamental LO signal that is input into the first mixer 10 is effectively eliminated.

In one embodiment, the second mixer 20 includes a first LO signal input terminal 221 and a second LO signal input terminal 222, and the fifth mixer 50 includes a first LO signal input terminal 531 and a second LO signal input terminal 532, where the first LO signal input terminal 221 of the second mixer 20 and the second LO signal input terminal of 532 of the fifth mixer 50 are both configured to receive a third LO signal; the second LO signal input terminal 222 of the second mixer 20 and the first LO signal input terminal of 531 of the fifth mixer 50 are both configured to receive a fourth LO signal.

In one embodiment, the third LO signal has a phase of 0°, and fourth LO signal has a phase of 180°; or the third LO signal has a phase of 90°, and the fourth LO signal has a phase of −90°.

In one example, as shown in FIG. 1, in the second mixer 20, the first LO signal input terminal 221 receives a third LO signal with a phase of 0°, and the second LO signal input terminal 222 receives a fourth LO signal with a phase of 180°, and in the fifth mixer 50, the first LO signal input terminal 531 receives a fourth LO signal with a phase of 180°, and the second LO signal input terminal 532 receives a third LO signal with a phase of 0°. Of course, alternatively, in the second mixer 20, the first LO signal input terminal 221 receives a third LO signal with a phase of 90°, and the second LO signal input terminal 222 receives a fourth LO signal with a phase of −90°, and in the fifth mixer 50, the first LO signal input terminal 531 receives a fourth LO signal with a phase of −90°, and the second LO signal input terminal 532 receives a third LO signal with a phase of 90°.

In this embodiment, there occurs cancellation of mixer noise between the second mixer 20 and the fifth mixer 50, thus port noise introduced by a fundamental LO signal that is input into the second mixer 20 is effectively eliminated.

In one embodiment, the third mixer 30 includes a first LO signal input terminal 321 and a second LO signal input terminal 322; the sixth mixer 60 includes a first LO signal input terminal 631 and a second LO signal input terminal 632, where the first LO signal input terminal 321 of the third mixer 30 and the second LO signal input terminal 632 of the sixth mixer 60 are both configured to receive a fifth LO signal; the second LO signal input terminal 322 of the third mixer 30 and the first LO signal input terminal 631 of the sixth mixer 60 are both configured to receive a sixth LO signal.

In one embodiment, the fifth LO signal has a phase of 45°, and the sixth LO signal has a phase of −135°; or the fifth LO signal has a phase of −45°, and the sixth LO signal has a phase of 135°.

In one example, as shown in FIG. 1, in the third mixer 30, the first LO signal input terminal 321 receives a fifth LO signal with a phase of 45°, and the second LO signal input terminal 322 receives a sixth LO signal with a phase of −135°, and in the sixth mixer 60, the first LO signal input terminal 631 receives a sixth LO signal with a phase of −135°, and the second LO signal input terminal 632 receives a fifth LO signal with a phase of 45°. Of course, alternatively, in the third mixer 30, the first LO signal input terminal 321 receives a fifth LO signal with a phase of −45°, and the second LO signal input terminal 322 receives a sixth LO signal with a phase of 135°, and in the sixth mixer 60, the first LO signal input terminal 631 receives a sixth LO signal with a phase of 135°, and the second LO signal input terminal 632 receives a fifth LO signal with a phase of −45°.

In this embodiment, there occurs cancellation of mixer noise between the third mixer 30 and the sixth mixer 60, thus port noise introduced by a fundamental LO signal that is input into the third mixer 30 is effectively eliminated.

Figure 2:
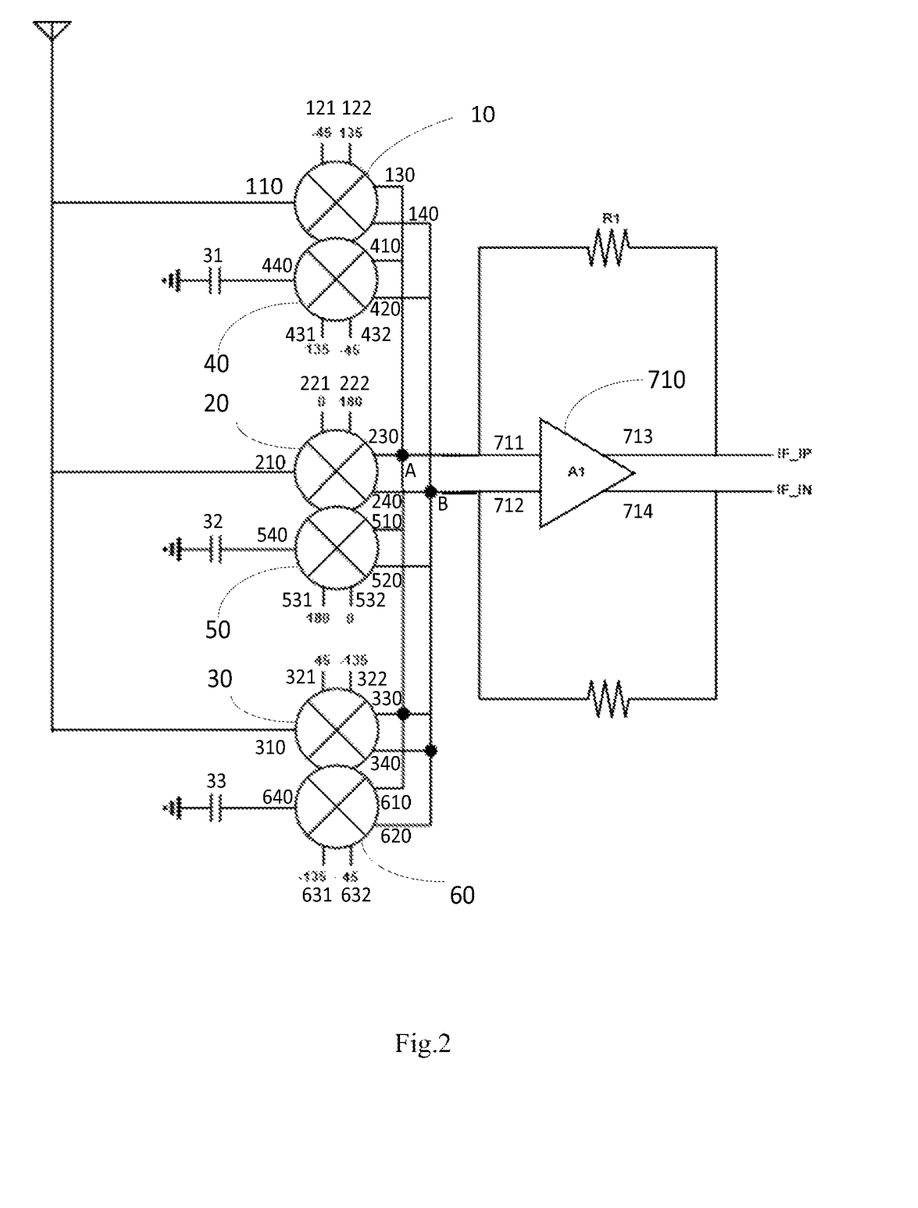
FIG. 2 is a schematic structural diagram of a harmonic rejection mixing circuit device according to another embodiment of the disclosure.

In one embodiment, as shown in FIG. 2, the signal amplifying circuit 70 includes a first stage of amplifier 710 and first resistors R1.

The first stage of amplifier 710 includes a first input terminal 711, a second input terminal 712, a first output terminal 713 and a second output terminal 714, with the first resistors R1 respectively connected in parallel between the first input terminal 711 and the first output terminal 713 as well as between the second input terminal 712 and the second output terminal 714, where the first input terminal 711 is connected to a first joint A, and the second input terminal 712 is connected to a second joint B.

Figure 3:
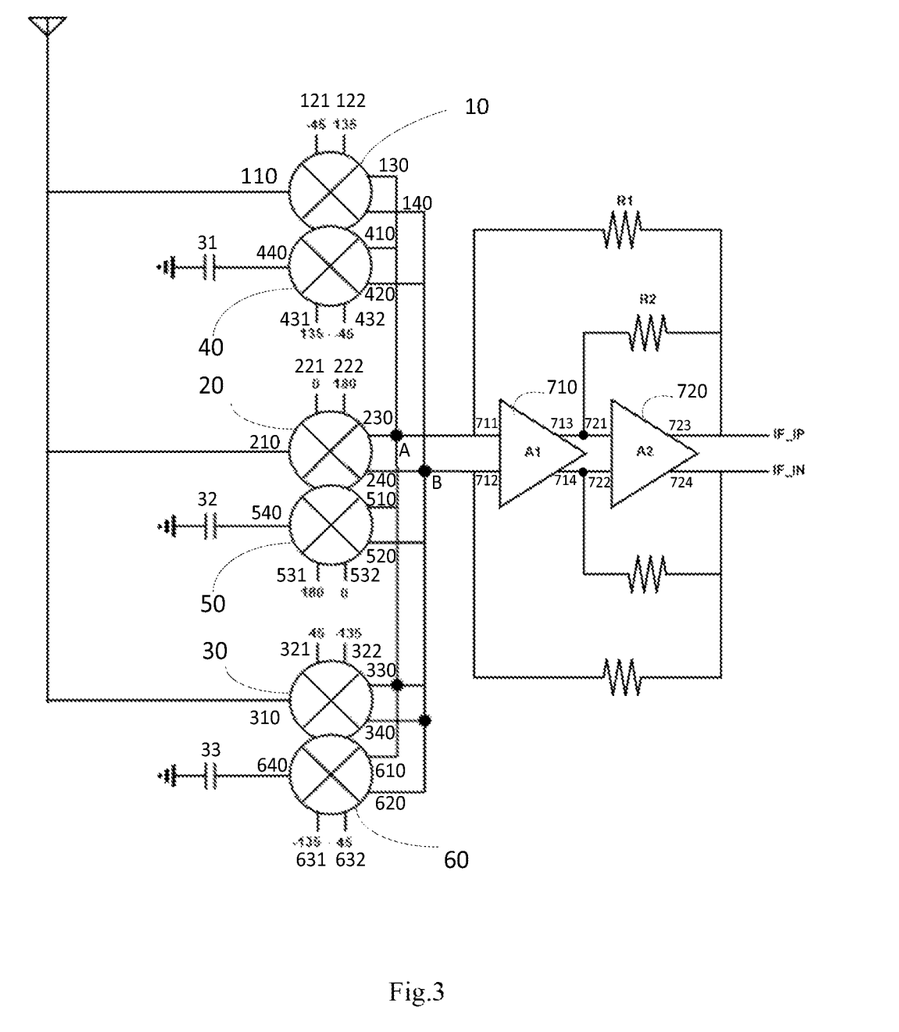
FIG. 3 is a schematic structural diagram of a harmonic rejection mixing circuit device according to still another embodiment of the disclosure.

In one embodiment, as shown in FIG. 3, the signal amplifying circuit 70 includes: a first stage of amplifier 710, first resistors R1, a second stage of amplifier 720 and second resistors R2.

The first stage of amplifier 710 includes a first input terminal 711, a second input terminal 712, a first output terminal 713 and a second output terminal 714, and the second stage of amplifier 720 includes a first input terminal 721, a second input terminal 722, a first output terminal 723 and a second output terminal 724, with the first output terminal 713 of the first stage of amplifier 710 connected to the first input terminal 721 of the second stage of amplifier 720, and the second output terminal 714 of the first stage of amplifier 710 connected to the second input terminal 712 of the second stage of amplifier 720.

The first resistor R1 are respectively connected in parallel between the first input terminal 711 of the first stage of amplifier 710 and the first output terminal 723 of the second stage of amplifier 720 as well as between the second input terminal 712 of the first stage of amplifier 710 and the second output terminal 724 of the second stage of amplifier 720; and the second resistors R2 are respectively connected in parallel between the first input terminal 721 of the second stage of amplifier 720 and the first output terminal 723 of the second stage of amplifier 720 as well as between the second input terminal 722 of the second stage of amplifier 720 and the second output terminal 724 of the second stage of amplifier 720.

In one example, the circuit structure formed by the first stage of amplifier 710, the second stage of amplifier 720, the first resistor R1 and the second resistor R2 may be referred to as a nested transimpedance amplifying circuit structure. The transconductance gm1 of the first stage of amplifier 710 may be calculated, and then the open-loop gain A of the nested transimpedance amplifier may be calculated from the transconductance gm1 as $A=gm1*R_2$, where $R_2$ represents the resistance of each second resistor R2. The noise figure can be effectively lowered by increasing the transconductance gm1 of the first stage of amplifier 710.

Given the resistance $R_1$ of the first resistor R1, the input impedance Zin of the nested transimpedance amplifier may be calculated as $Zin=R_1/(gm1*R_2)$. In order to ensure to achieve accurate source impedance matching and reduce the return loss, the input impedance should take a fixed value. Therefore, $R_2$ should be lowered if gm1 is increased.

Since $R_1/R_2$ is a fixed value and the input return loss or the input reflection coefficient S11 is in proportion to the ratio of $R_1/R_2$, the changes in the on-chip resistances $R_1$ and $R_2$ will not affect source impedance matching. If the S11 is decreased, the input impedance matching becomes better, and the transmission loss of the signal is reduced. Further, if the gain of the second stage of amplifier 720 is increased, the linearity of the signal mixing circuit device is improved, which not only can meet the source impedance matching, effectively lower the noise figure and improve the gain and the linearity, but also can reduce the circuit area and lower the power consumption.

In one embodiment, the first stage of amplifier 710 and/or the second stage of amplifier 720 includes a single-stage complementary metal oxide semiconductor circuit unit. The single-stage complementary metal oxide semiconductor circuit unit provided has a small area and a small power consumption, while providing a large enough current signal or voltage signal for noise reduction.

In one embodiment, the first stage of amplifier 710 and/or the second stage of amplifier 720 includes a multi-stage complementary metal oxide semiconductor circuit unit. Open-loop gain may be increased by employing the multi-stage complementary metal oxide semiconductor circuit unit, thereby achieving better linearity. The multi-stage complementary metal oxide semiconductor circuit unit may be set as practically required, which all falls into the protection scope of the embodiment of the disclosure.

Figure 4:
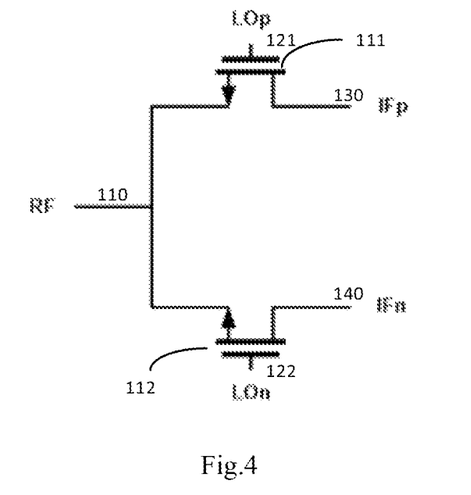
FIG. 4 is a schematic structural diagram of a first mixer according to an embodiment of the disclosure.
Figure 5:
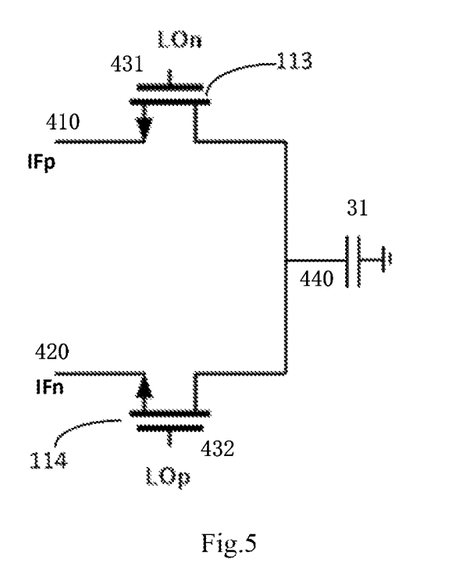
FIG. 5 is a schematic structural diagram of a fourth mixer according to an embodiment of the disclosure.

In one embodiment, as shown in FIG. 4 and FIG. 5, the internal structures of the first mixer 10 and the fourth mixer 40 are shown. Illustration will be given by taking the first mixer 10 and the fourth mixer 40 as an example. The internal structures of the second mixer 20 and the fifth mixer 50 as well as the third mixer 30 and the sixth mixer 60 are similar and thus the description thereof will be repeated.

As shown in FIG. 4, the first mixer 10 includes a first transistor switch 111 and a second transistor switch 112.

The first transistor switch 111 includes a gate for receiving a first LO signal, a drain and a source.

The second transistor switch 112 includes a gate for receiving a second LO signal, a drain and a source.

The source of the first transistor switch 111 and the source of the second transistor switch 112 are connected to each other for receiving the RF signal.

The drain of the first transistor switch 111 functions as the first mixed-signal output terminal 130, and the drain of the second transistor switch 112 functions as the second mixed-signal output terminal 140.

In one example, the first transistor switch 111 and the second transistor switch 112 may be a PMOS transistor or an NMOS transistor. The gate of the first transistor switch 111 functions as the first LO signal input terminal 121, and the gate of the second transistor switch 112 functions as the second LO signal input terminal 122. The first transistor switch 111 and the second transistor switch 112 are configured to sample the RF signal and down-convert it to an intermediate frequency signal. Specifically, the RF signal may be down-converted into a differential intermediate frequency signal by employing a differential sampling clock. The purpose of down conversion is to lower the carrier frequency of the signal or simply remove the carrier frequency to obtain a baseband signal. The first mixed signal IFp and the second mixed signal Ifn may be differential intermediate frequency signals.

In one embodiment, as shown in FIG. 5, the fourth mixer 40 includes a first transistor switch 113 and a second transistor switch 114.

The first transistor switch 113 includes a gate for receiving a second LO signal, a source and a drain, and the fourth transistor switch 114 includes a gate for receiving a first LO signal, a source and a drain.

The source of the first transistor switch 113 functions as the first mixed-signal output terminal 410 of the fourth mixer, and the source of the second transistor switch functions as the second mixed-signal output terminal 420 of the fourth mixer.

The drains of the first transistor switch 113 and the second transistor switch 114 are both connected to a capacitor 31.

In one example, the first transistor switch 113 and the second transistor switch 114 may be a PMOS transistor or an NMOS transistor. The gate of the first transistor switch 113 functions as the first LO signal input terminal 431 of the fourth mixer 40 and to receive a second LO signal, and the source of the first transistor switch 113 is configured to output a first mixed signal IFp. The gate of the second transistor switch 114 functions as the second LO signal input terminal 432 of the fourth mixer 40 to receive a first LO signal, and the source of the second transistor switch 114 is configured to output a second mixed signal IFn.

Figure 6:
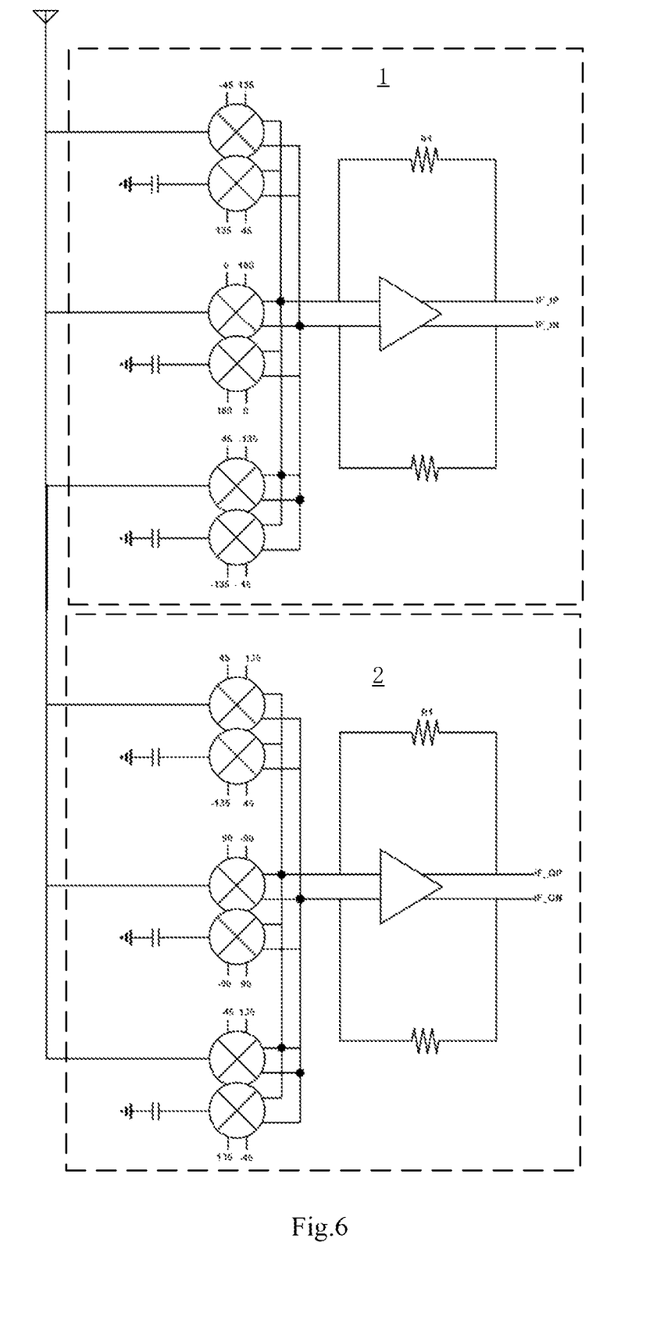
FIG. 6 is a schematic structural diagram of a harmonic rejection mixing circuit device according to still another embodiment of the disclosure.
Figure 7:
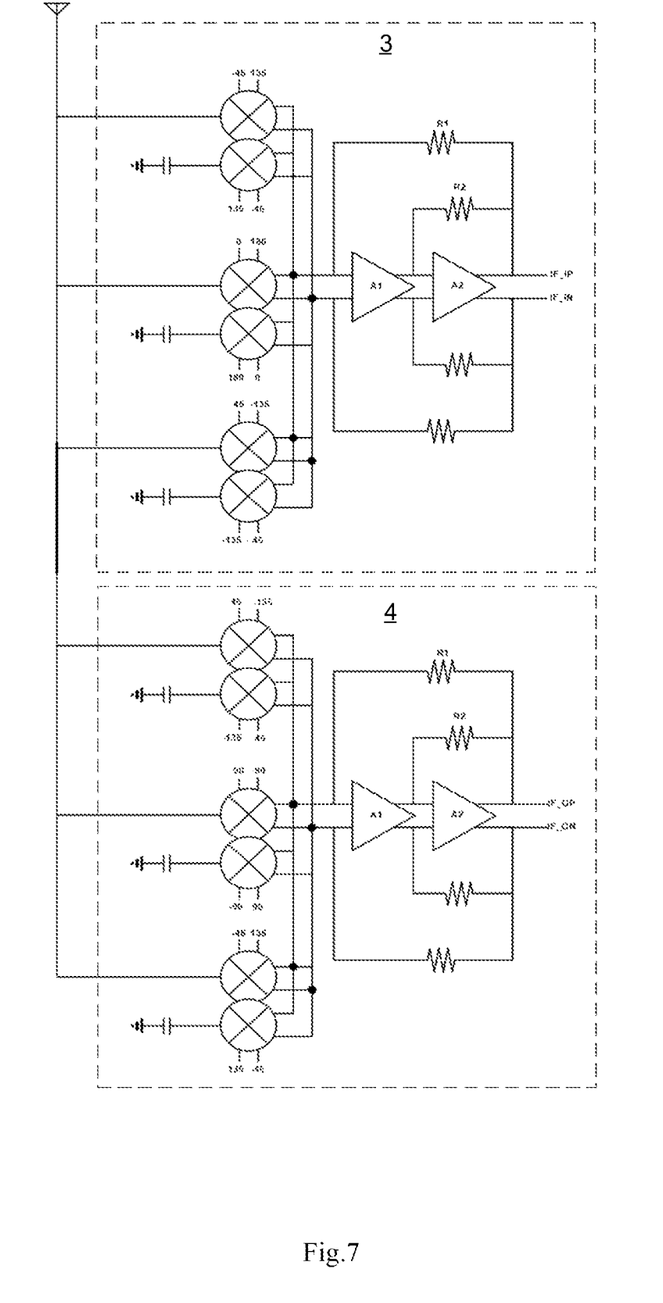
FIG. 7 is a schematic structural diagram of a harmonic rejection mixing circuit device according to still another embodiment of the disclosure.

As shown in FIG. 6, the receiver includes at least one signal mixing circuit device according to the above embodiments. For example, the receiver includes two harmonic rejection mixing circuit devices 1, 2. As shown in FIG. 7, the receiver includes at least one signal mixing circuit device according to the above embodiments. For example, the receiver includes two harmonic rejection mixing circuit devices 3, 4. Of course, more signal mixing circuit devices may be provided as practically required, which all falls into the protection scope of the embodiment of the disclosure.

Figure 8:
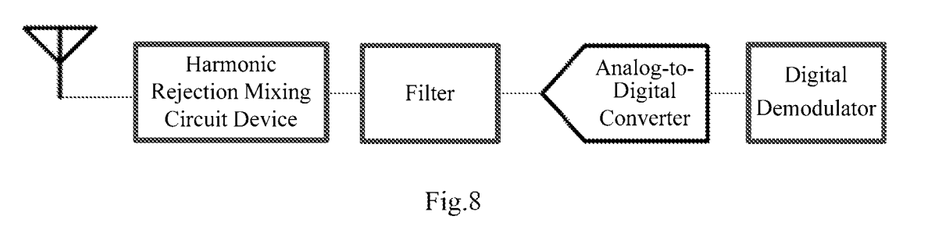
FIG. 8 is a schematic diagram of a receiver according to an embodiment of the disclosure.

As shown in FIG. 8, a filter, an analog-to-digital converter and a digital demodulator are sequentially connected after the harmonic rejection mixing circuit device, where, the filter may be an analog baseband filter, etc. Since a harmonic rejection mixing circuit device according to the above embodiment may replace the band-pass filter or low-pass filter, the Matching Network (MN), the Low Noise Amplifier (LNA) and the mixer in the conventional receiver, the volume of the receiver can be effectively reduced, the power consumption can be lowered, and the signal amplification efficiency may be improved.

The above description illustrates merely some specific implementation of the present disclosure, but is not intended to limit the scope of protection of the present disclosure, and any variation or replacement readily occurring to those skilled in the art within the technical scope disclosed by the present disclosure should be covered by the protection scope of the present disclosure. Therefore, the protection scope of the present disclosure should be subject to the protection scope of the claims.

What is claimed is:

1. A harmonic rejection mixing circuit device, comprising a signal amplifying circuit, a first mixer, a second mixer, a third mixer, a fourth mixer, a fifth mixer and a sixth mixer, wherein the circuit device is configured such that:

input terminals of the first mixer, the second mixer and the third mixer receive a radio frequency (RF) signal, and input terminals of the fourth mixer, the fifth mixer and the sixth mixer are respectively connected to capacitors, with outputs from the first mixer, the second mixer, the third mixer, the fourth mixer, the fifth mixer and the sixth mixer combined to be input to the signal amplifying circuit; and the first mixer samples a first group of local oscillator (LO) signals, and the fourth mixer phase-invertedly samples the first group of LO signals; the second mixer samples a second group of LO signals, and the fifth mixer phase-invertedly samples the second group of LO signals; the third mixer samples a third group of LO signals, and the sixth mixer phase-invertedly samples the third group of LO signals, wherein each of the first mixer and the fourth mixer further comprises a first LO signal input terminal and a second LO signal input terminal, with the first LO signal input terminal of the first mixer and the second LO signal input terminal of the fourth mixer both configured to receive a first LO signal, and the second LO signal input terminal of the first mixer and the first LO signal input terminal of the fourth mixer both configured to receive a second LO signal.

2. The circuit device of claim 1, wherein the first mixer, the second mixer and the third mixer have respective output terminals connected to each other, the fourth mixer has output terminals connected to the output terminals of the first mixer, the fifth mixer has output terminals connected to the output terminals of the second mixer, and the sixth mixer has output terminals connected to the output terminals of the third mixer, such that respective output terminals of the first mixer, the second mixer, the third mixer, the fourth mixer, the fifth mixer and the sixth mixer are all connected to the signal amplifying circuit.

3. The circuit device of claim 2, wherein each of the first mixer, the second mixer, the third mixer, the fifth mixer and the sixth mixer comprises a first mixed-signal output terminal and a second mixed-signal output terminal, with all first mixed-signal output terminals connected to each other at a first joint and all second mixed-signal output terminals connected to each other at a second joint, both the first joint and the second joint being connected to the signal amplifying circuit.

4. The circuit device of claim 1, wherein the first LO signal and the second LO signal have phases of −45° and 135° respectively; or the first LO signal and the second LO signal have phases of 45° and −135° respectively.

5. The circuit device of claim 3, wherein each of the second mixer and the fifth mixer comprises a first LO signal input terminal and a second LO signal input terminal, with the first LO signal input terminal of the second mixer and the second LO signal input terminal of the fifth mixer both configured to receive a third LO signal, and the second LO signal input terminal of the second mixer and the first LO signal input terminal of the fifth mixer both configured to receive a fourth LO signal.

6. The circuit device of claim 5, wherein the third LO signal and the fourth LO signal have phases of 0° and 180° respectively, or the third LO signal and the fourth LO signal have phases of 90° and −90° respectively.

7. The circuit device of claim 3, wherein each of the third mixer and the sixth mixer comprises a first LO signal input terminal and a second LO signal input terminal, with the first LO signal input terminal of the third mixer and the second LO signal input terminal of the sixth mixer both configured to receive a fifth LO signal, and the second LO signal input terminal of the third mixer and the first LO signal input terminal of the sixth mixer both configured to receive a sixth LO signal.

8. The circuit device of claim 7, wherein the fifth LO signal and the sixth LO signal have phases of 45° and −135° respectively; or the fifth LO signal and the sixth LO signal have phases of −45° and 135° respectively.

9. The circuit device of claim 3, wherein the signal amplifying circuit comprises a first stage of amplifier and first resistors, the first stage of amplifier comprising a first input terminal, a second input terminal, a first output terminal and a second output terminal, with the first resistors respectively connected in parallel between the first input terminal and the first output terminal as well as between the second input terminal and the second output terminal, wherein the first input terminal is connected to the first joint and the second input terminal is connected to the second joint.

10. The circuit device of claim 3, wherein the signal amplifying circuit comprises a first stage of amplifier, first resistors, a second stage of amplifier and second resistors, wherein:
    each of the first stage of amplifier and the second stage of amplifier comprises a first input terminal, a second input terminal, a first output terminal and a second output terminal, with the first output terminal of the first stage of amplifier connected to the first input terminal of the second stage of amplifier, and the second output terminal of the first stage of amplifier connected to the second input terminal of the second stage of amplifier;
    the first resistors are respectively connected in parallel between the first input terminal of the first stage of amplifier and the first output terminal of the second stage of amplifier as well as between the second input terminal of the first stage of amplifier and the second output terminal of the second stage of amplifier; and
    the second resistors are respectively connected in parallel between the first input terminal of the second stage of amplifier and the first output terminal of the second stage of amplifier as well as between the second input terminal of the second stage of amplifier and the second output terminal of the second stage of amplifier.

11. The circuit device of claim 9, wherein the first stage of amplifier comprises a single-stage complementary metal oxide semiconductor circuit unit.

12. The circuit device of claim 10, wherein at least one of the first stage of amplifier and the second stage of amplifier comprises a single-stage complementary metal oxide semiconductor circuit unit.

13. The circuit device of claim 9, wherein the first stage of amplifier comprises a multi-stage complementary metal oxide semiconductor circuit unit.

14. The circuit device of claim 10, wherein at least one of the first stage of amplifier and the second stage of amplifier comprises a multi-stage complementary metal oxide semiconductor circuit unit.

15. The circuit device of claim 1, wherein the first mixer comprises a first transistor switch and a second transistor switch, each of which comprises a gate, a drain and a source, wherein:
    the gate of the first transistor switch is configured to receive the first LO signal, and the gate of the second transistor switch is configured to receive the second LO signal;
    the source of the first transistor switch and the source of the second transistor switch are connected to each other and configured to receive the RF signal; and
    the drain of the first transistor switch functions as the first mixed-signal output terminal of the first mixer, and the drain of the second transistor switch functions as the second mixed-signal output terminal of the first mixer.

16. The circuit device of claim 1, wherein the fourth mixer comprises a first transistor switch and a second transistor switch, each of which comprises a gate, a source and a drain, wherein:
    the gate of the first transistor switch is configured to receive the second LO signal, and the gate of the second transistor switch is configured to receive the first LO signal;
    the source of the first transistor switch functions as the first mixed-signal output terminal of the fourth mixer, and the source of the second transistor switch functions as the second mixed-signal output terminal of the fourth mixer; and the drain of the first transistor switch and the drain of the second transistor switch are both connected to one of the capacitors.

17. A receiver comprising at least one signal mixing circuit device of claim 1.

* * * * *